(12) United States Patent
Devin et al.

(10) Patent No.: US 6,219,277 B1
(45) Date of Patent: Apr. 17, 2001

(54) DEVICE AND METHOD FOR THE READING OF EEPROM CELLS

(75) Inventors: Jean Devin, Le Tholonet; David Naura; Sebastien Zink, both of Aix En Provence, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/300,527

(22) Filed: Apr. 27, 1999

(30) Foreign Application Priority Data

Apr. 28, 1998 (FR) .................................................. 98 05330

(51) Int. Cl.[7] ...................................................... G11C 7/00
(52) U.S. Cl. ................ 365/185.21; 365/185.21; 365/210
(58) Field of Search ........................... 365/185.2, 185.21, 365/210

(56) References Cited

U.S. PATENT DOCUMENTS

| | | | |
|---|---|---|---|
| 5,406,514 | 4/1995 | Yoneda | 365/182 |
| 5,659,503 | 8/1997 | Sudo et al. | 365/185.2 |
| 5,699,295 | * 12/1997 | Yero | 365/185.2 |
| 5,773,997 | * 6/1998 | Stiegler | 365/185.2 |
| 5,889,702 | * 3/1999 | Gaultier et al. | 365/185.2 |

FOREIGN PATENT DOCUMENTS 0 175 101 A2   7/1985   (EP) .

OTHER PUBLICATIONS

1990 IEEE International Solid–State Circuits Conference Digest of Technical Papers, Vancu et al., Nonvolatile and Fast Static Memories, Feb. 14, 1990, pp. 63–65.

* cited by examiner

*Primary Examiner*—Son T. Dinh
(74) *Attorney, Agent, or Firm*—Theodore E. Galanthay; Allen, Dyer Doppelt, Milbrath & Gilchrist, P.A.

(57) ABSTRACT

A device and method for the reading of cells of an EEPROM is provided. The device includes at least one reference cell and one circuit for comparison between a current flowing into the reference cell and a current flowing in a cell selected in read mode. The reference cell is in a programmed state. The programming of the reference cell is done after the control reading and during the integrated circuit power-on reset phase, activated by the powering on of the integrated circuit.

45 Claims, 5 Drawing Sheets

DEVICE AND METHOD FOR THE READING OF EEPROM CELLS

FIELD OF THE INVENTION

The present invention relates to integrated circuits having an EEPROM memory. In particular, the invention relates to a device and method for the reading of EEPROM type memory cells.

BACKGROUND OF THE INVENTION

Usually, the reading an EEPROM type memory involves a comparison of the current consumed in a cell selected in read mode and a reference cell in the blank state with the two cells being biased under the same voltage conditions. Each cell draws a certain current. Depending on whether the higher current is obtained from one cell or the other, the level of the output of a detector switches to zero or to one. From this, it is determined whether the selected cell is erased or programmed. An EEPROM cell conventionally comprises at least one MOS selection transistor and one MOS floating-gate transistor. It is the MOS floating-gate transistor that is actually written in while the MOS selection transistor is used only to cut off or permit the selection of the memory cell in the matrix of memory cells.

It is known that the principle of the reading of a memory cell of this kind relies on the different threshold voltages that a floating-gate transistor may have, depending on whether it is in the blank, erased or programmed states. In standard EEPROM memory technology, the threshold voltage $VthE$ of an erased cell will be, for example, about 3 volts, the threshold voltage $Vthv$ of a blank cell will be about 0.8 volts and the threshold voltage $VthP$ of a programmed cell will be about −2 volts. The biasing conditions usually chosen are such that the reference cell, which is blank, is on. The gate bias voltage of a floating-gate transistor must therefore be higher than the threshold voltage of a blank cell, namely higher than +0.8 volts. It will be noted that it is therefore necessary to have a read reference voltage generator. The read bias voltage applied to the read/write circuit on the bit line or lines is about 1 volt while the bias voltage applied to the selected word line is in the range of VCC.

At identical read bias voltages, the reference blank cell will consume more current than the erased cell and less current than the programmed cell. The comparison of the currents gives a corresponding binary response. The current drawn by each cell is normally the one dictated by the floating-gate transistor. However, for this purpose, the associated selection transistors must have the capacity to deliver the corresponding current.

Now, at very low voltages, the capacity of the selection transistors to deliver current is reduced. There is therefore a risk of saturation even with very low currents. In this case, it is no longer the floating-gate transistor that dictates the current in the cell but the selection transistor which can no longer give anything more than a borderline saturation current. In other words, if a supply voltage VCC is at a sufficiently high level, for example between 3 and 5 volts, the memory cell (comprising the selection transistor and the floating-gate transistor) may consume between 0 to 40 microamperes under usual read bias conditions. There is therefore a sufficient margin of current to differentiate between the different states of the cell, namely the blank, erased and programmed states. However, when the supply voltage VCC is lowered to 2 volts, the current can no longer vary to the same extent. It is limited by the saturation current of the selection transistor. It is limited, for example, to two microamperes. The margin of differentiation in current becomes extremely small, and even more so as it is necessary to integrate the variations due to the manufacturing method and the dispersion in the cells. The reading of EEPROM type memory cells according to the usual method is therefore no longer reliable at the low or very low voltages.

One approach to this problem of reading at low voltages may include the use of a load pump device for the read operation, in order to recover the usual bias conditions, especially to enable the application of a voltage of 5 volts to the word lines (the gate of the selection transistor). In this way, the selection transistor is capable of meeting the current demand of the memory cell. There would be little adverse effect on the read mode access time, provided that the pump used has a high fan-out and is capable of taking the word line to the desired bias voltage very quickly. Furthermore, this pump would have to work even in standby mode. Otherwise, the time of access to the memory would be heavily penalized.

The drawback of a requirement of this kind is that it considerably increases consumption in standby mode. This additional consumption rules out this approach for portable applications, which make great use of EEPROMs. Furthermore, the fact of using a pump to generate the read bias voltages entails the risk of causing highly inconvenient electrical disturbances. In particular, in the decoder, it is a concern that there may be problems of coupling between signals of the decoder and signals of the oscillator of the pump.

Another approach to the problem could lie in improving the characteristics of the selection transistor so that it is capable of delivering sufficient current at a low voltage. The fan-out of the selection transistor could be increased. However, increasing the fan-out means considerably increasing the size of the transistor. Although this might be acceptable in a simple circuit element, it is heavily disadvantageous for an application to a memory circuit in which there is one selection transistor per memory cell.

It is also possible to further lower the threshold voltage of the selection transistor. However, in practice, this solution is limited by the breakdown voltage which the selection transistor should be capable of withstanding without damage because of the high voltages that are applied to it in erase mode or programming mode. Furthermore, the threshold voltage itself cannot be lower than a borderline voltage dictated by the laws of physics (this borderline voltage may be 200 millivolts for a given technology). Below this borderline voltage, the selection transistor would be conductive in read mode, even if the cell were not selected (hot read operation). The selection transistor would therefore no longer be capable of fulfilling its function of insulating the memory cell in the matrix.

SUMMARY OF THE INVENTION

It is an object of the invention to resolve the problem of the reading of EEPROM cells at a low voltage. In the invention, EEPROM cells are reliably read even at a low voltage. According to the invention, instead of using a cell in the blank state as a reference cell, a programmed cell is used. In this way, all that has to be done is to discriminate between two states: the erased state or the programmed state. The current margin for discriminating between the two states no longer needs to be as great. Furthermore, a programmed cell has a negative threshold voltage, for example equal to −2 volts, whereas an erased cell has a positive threshold voltage of about 3 volts. A threshold voltage of less than +3 volts is taken as a read bias voltage for the cell (namely the voltage applied to the gate of the floating-gate transistor of the cell).

As characterized, the invention therefore relates to a device for the reading of cells of an EEPROM. The device comprises at least one reference cell and one circuit for comparison between a current flowing through this reference cell and a current flowing in a cell selected in read mode. According to the invention, the reference cell is in a programmed state.

Advantageously, the voltage chosen as the read bias voltage is the zero voltage Vss. Thus, there is no problem of generating a particular reference voltage. There are voltage variation problems of this voltage with the usual parameters: supply voltage, characteristics (threshold voltages) of the manufacturing method, temperature, etc. There is no problem of matching the level of this bias voltage to the nominal level of the supply voltage used (3 volts, 2 volts, . . . ), which may depend on the application. Thus, whatever the level of the supply voltage applied to this circuit and whatever the variations of the parameters of the circuit, the read device according to the invention is reliable.

In the invention, to carry out the programming of the reference cell, a control circuit is provided to perform a control reading of the reference cell or cells and a programming operation if necessary. This control circuit is activated during a power-on reset phase controlled by a circuit for the detection of the powering on of the integrated circuit. Preferably, this circuit comprises means to carry out a precharging, at VCC, of a voltage node of each reference cell. The ground node being connected to the ground VSS, and the read bias voltage VCG being applied to the control gate of the floating-gate transistor of each reference cell. The voltage node then gives a signal for the activation of the programming. Advantageously, to carry out the programming if necessary, the generation of the high programming voltages is activated and this high voltage is applied to the reference cells by using the precharging means.

The invention also relates to a method for the reading of cells of an EEPROM using the comparison of the currents flowing in a reference cell and a selected memory cell. According to the invention, this method includes the preliminary programming of the reference cell.

BRIEF DESCRIPTION OF THE DRAWINGS

Other features and advantages of the invention are described in detail in the following description, given by way of an indication that in no way restricts the scope of the invention, and with reference to the appended drawings, of which.

DETAILED DESCRIPTION OF THE PREFERRED EMBODIMENTS

Figure 1:
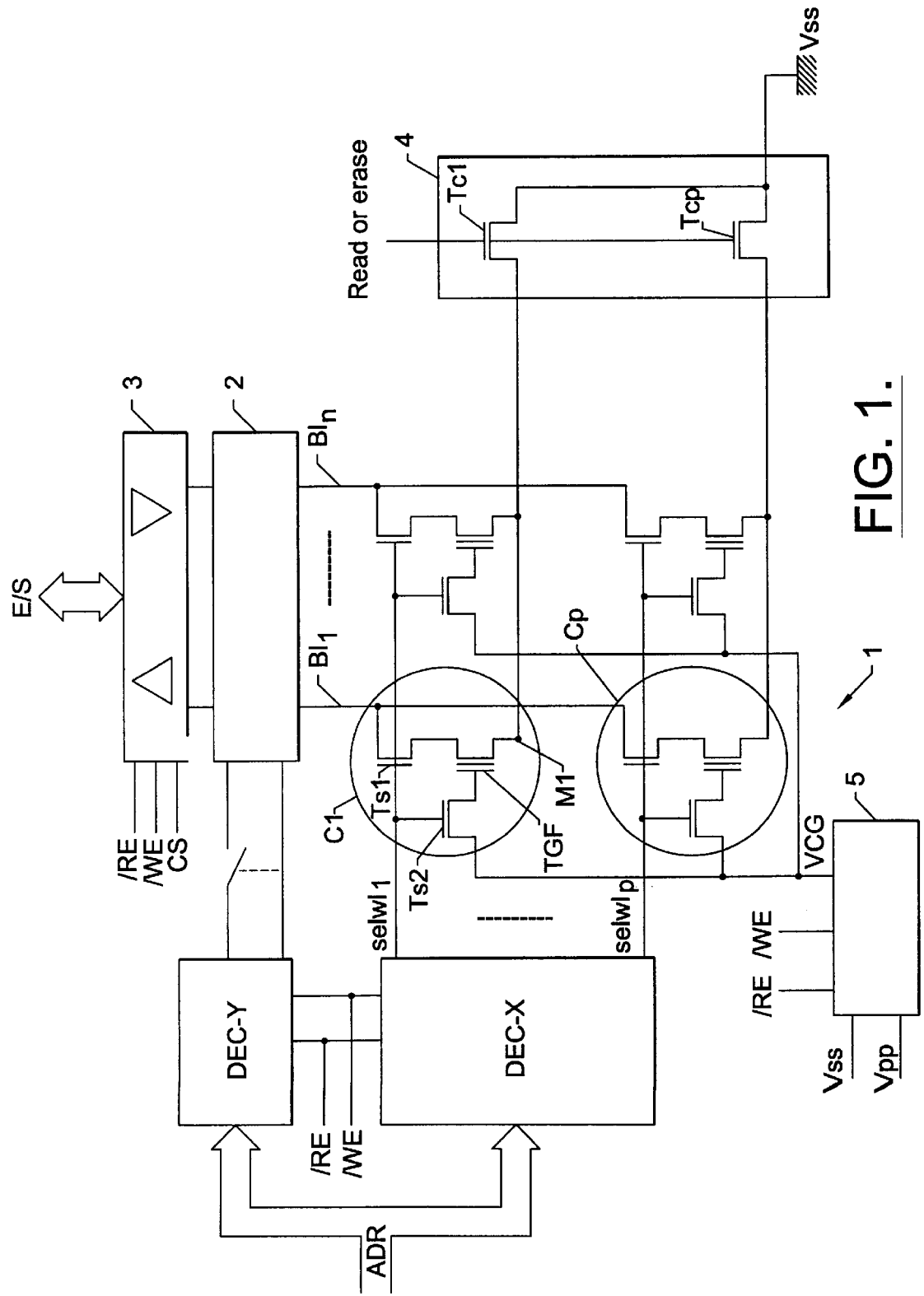
FIG. 1 is a block diagram of an exemplary architecture of an EEPROM type memory.

FIG. 1 shows an exemplary architecture of an EEPROM in an integrated circuit. The integrated circuit may comprise elements other than the EEPROM, such as a microcontroller or other types of memory. FIG. 1 shows a standard EEPROM architecture. This architecture comprises an array of EEPROM cells 1 organized in matrix form in word lines (rows) and bit lines (columns). The memory cells can be accessed by a word line decoder DEC-X and a bit line decoder DEC-Y associated with a gate circuit 2. The gate circuit is connected to a read/write circuit 3 associated with the data input/output bus E/S. The architecture also comprises a command circuit 4 for the ground node of the memory array and a command circuit 5 for the gate bias voltage Vcg of the floating-gate transistor of the memory cell. This is of course the voltage applied to the control gate of this transistor.

Each cell of the memory array, for example the cell C1, comprises a floating-gate transistor TGF and a first selection transistor Ts1 that are series-connected between the associated bit line BL1 and a ground node M1 of the cell. The first selection transistor Ts1 is driven at its gate by the selection signal of the associated word line selWl1.

In the example shown, the EEPROM cell comprises a second selection transistor Ts2 which is driven by the same word line selection signal selWl1 as the first selection transistor Ts1. The second selection transistor Ts2 enables the gate bias voltage VCG to be switched over to the control gate of the floating-gate transistor TGF of the memory cell. This gate bias voltage VCG is typically equal to 0 volts (Vss) in read mode or programming mode and to the high voltage Vpp in erasure mode. Finally, the ground node M1 of the cell C1 is driven by a MOS transistor Tc1 of the ground Vss switching circuit 4. In the example, this circuit comprises one ground switching transistor per word line and therefore comprises as many switching transistors as the memory array has word lines (P in the example). Other arrangements are possible of course.

The switching circuit 4 is activated to apply Vss to the ground node of all the memory array cells. This circuit is especially activated for an operation of reading or erasing cells of the memory. When it is deactivated (especially in programming mode), the ground nodes of the memory array are in a state of high impedance. The decoders DEC-X and DEC-Y receive address signals from the address bus ADR of the integrated circuit and read /RE or write /WE command signals, from a command circuit or a sequencer (not shown). At output, the decoders give selection signals selWl1–selWlp for the word line decoder and selBl1–selBln for the bit line decoder. The bit line selection signals are applied to the gate circuit 2 which conventionally comprises switching transistors for the application, to the selected bit lines, of well specified bias voltages driven by the read/write circuit 3 as a function of the operation to be performed. In the case of the word lines, the bias voltage is switched over to the signal for the selection of the word line that is addressed.

In read mode, VCC is thus recovered at the selected word line and about 1 volt at the selected bit lines. The read device according to the invention forms part of the read/write circuit 3. A device for the reading of memory cells usually comprises at least one reference cell, a current comparison circuit and an output amplifier. The reference cell and the memory cell selected in read mode receive the same bias voltages, especially the same bias voltage VCG for the control gate of the floating-gate transistor TGF.

According to the invention, to read a memory cell, a programmed reference cell is used instead of a blank reference cell. It is enough to choose the gate bias voltage VCG so that it is lower than the threshold voltage Vthe of an erased memory cell (erased floating-gate transistor) which is about +3 volts. With a gate bias voltage VCG such as this, the reference cell, which is programmed, is conductive. The cell selected in read mode will be conductive when it is also in a programmed state but will not be conductive if it is in an erased state. The current comparison is particularly simple.

Preferably, in the invention, it is chosen to have the gate bias voltage VCG equal to zero volts (Vss) in read mode. Thus, time is gained in read mode because there is no waiting for the generation and stabilization of a read reference voltage. Furthermore, the reference VCG=Vss is highly stable and valid, whatever the level of the supply voltage VCC of the integrated circuit, and is independent of the size of the memory. The other bias voltages are usually about 1 volt for the bit line and Vcc for the word line.

Figure 2:
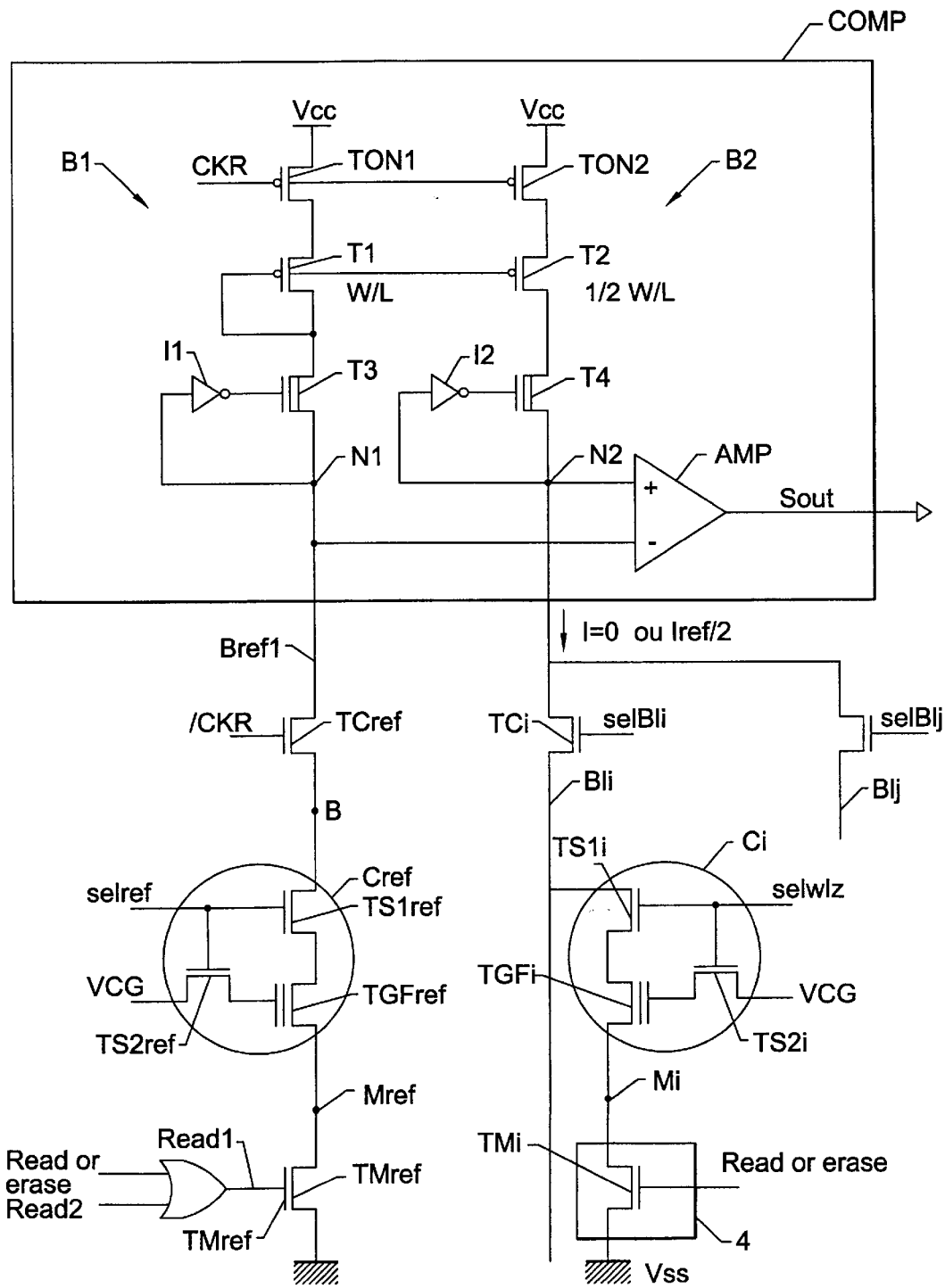
FIG. 2 shows a read device according to the invention.

An exemplary read device according to the invention is described in detail with reference to FIG. 2. It comprises a reference cell Cref, a current comparison circuit COMP and an output amplifier AMP. The amplifier gives the binary signal corresponding to the read operation performed at output Sout. In fact, the read device commonly comprises one current reference arm and K current comparison arms associated with K output amplifiers enabling the reading of several cells of the memory at the same time, belonging to one and the same word line (the reading of a byte). The read device may also comprise 8 to 16 output amplifiers. FIG. 2 shows only one output amplifier.

The current comparison circuit COMP is standard. In the simplified example shown, it comprises a reference arm B1 and another arm B2. Each arm has a current generator and a current-voltage converter series-connected between the supply voltage VCC and an output node. An additional transistor, T$_{ON}$1 in the arm B1, T$_{ON}$2 in the arm B2, is provided in each arm. Each additional transistor is connected between the supply voltage Vcc and the current generator, and driven by an activation signal CKR controlled by the read command signal /RE. Thus, the comparison circuit is supplied only during the performance of a read operation. This enables the consumption of the integrated circuit to be limited.

The reference arm B1 is used for the current supply and biasing (at about 1 volt) of a reference bit line Bref1 comprising a reference cell Cref. The other arm B2 is used for the current supply and biasing of a bit line Bli comprising a memory cell Ci selected in read mode.

In the example, the current generator of the reference arm B1 comprises a PMOS transistor T1 having its gate connected to its drain and its source connected to the supply voltage Vcc through the transistor T$_{ON}$1. The current generator of the other arm B2 comprises a PMOS transistor T2 connected to Vcc through the transistor T$_{ON}$2. Its gate is driven by the gate of the transistor T1, so that these two transistors form a current mirror. The current/voltage converter of the reference arm B1 comprises an NMOS transistor T3 connected between the drain of the transistor T1 and the output node N1 of the reference arm B1. An inverter I1 loops its source back to its gate. The current/voltage converter of the second arm is similar, with an NMOS transistor T4, an inverter I2 and an output node N2. The output node N1 of the reference arm is connected to an input of the output amplifier AMP, the—inverter input in the example, while the output node N2 is connected to the other input, the + non-inverter input in the example.

This is an exemplary embodiment of a current comparator in a read device. There are various alternatives for improving the speed performance characteristics, reducing consumption in standby mode, etc. These are all alternatives that are not shown but are all equally usable in the read device according to the invention.

The output node N1 of the reference arm B1 is connected to the reference bit line Bref1, comprising the reference cell Cref. The output node N2 of the other arm B2 is connected to at least one bit line of the memory. In fact, the output N2 may be connected to several bit lines, in the example Bli, Blj. Indeed, in the case of a high capacity memory, having one read device per bit line is unlikely. The resources have to be shared. In read mode, only one bit line out of the bit lines Bli to Blj connected to the output node N2 is selected. For example, if the line Bli is selected, it is the corresponding bit line selection signal selBli and the transistor of the corresponding gate circuit 4 that connects it actively to the output node N2. The other bit lines are insulated from the node.

Usually, so that the current comparison may be accurate, the reference bit line comprises the same elements as those that are activated on the bit line of the memory cell selected in read mode. If we consider the cell Ci of the bit line Bli, between the output node N2 and the ground Vss, we find a first switching transistor Tci of the gate circuit 2, series-connected with the memory cell Ci. This switching transistor is driven by the selection signal selBli.

The memory cell Ci comprises a first selection transistor Ts1i and a second selection transistor Ts2i that are driven by the corresponding word line selection signal selwlz and a floating-gate transistor TGFi. Finally, a switching transistor 4 for the selection of the ground is connected between the ground node Mi of the cell and the ground Vss of the integrated circuit.

Thus, all these elements are also provided in the reference bit line. The reference cell is connected between a voltage node B and a ground node Mref. A first switching NMOS transistor Tcref is connected between the node N1 and the voltage node B of the reference cell Cref. Like all the cells of the memory array and with the same arrangement, the reference cell comprises a floating-gate transistor TGFref, a first selection transistor Ts1ref and a second selection transistor Ts2ref. Finally, a second switching transistor TMref is provided between the ground node Mref of the reference cell and the ground Vss.

The first switching NMOS transistor TCref is driven, in the example, by the reverse of the read activation signal, namely it is driven by /CKR. This transistor is therefore on during each memory cell read operation. The first selection transistor Ts1ref and the second selection transistor Ts2ref are driven by a command signal selref. The second switching transistor TMref is driven by a command signal Readi, activated for a read operation, an erase operation or a control read operation (Read2) specific to the invention which shall be explained hereinafter with reference to FIG. 3.

The operation of a read device of this kind is well known. The current mirror is such that the switch-over threshold of the read amplifier corresponds to the middle of the current window, namely between 0 volts (erased cell) and for example 2 to 5 microamperes (programmed cell). For this circuit, in the comparator with two arms B1 and B2, ½ is chosen as the ratio of the geometries of the current mirror (the ratio between W/L of T1 and W/L of T2) as shown in FIG. 2. In a practical example, there will thus be a current Iref of 2 to 5 microamperes in the reference arm, giving a certain voltage level at the node N1 applied to an input of the differential amplifier. If the memory cell to be read, for example Ci, is erased, it is not conductive and the corresponding node N2 rises to Vcc. The voltage at N2 is therefore greater than the voltage at N1 and the differential amplifier switches over in one direction. If the memory cell Ci is programmed, there will be a current I in the cell Ci equal to half the reference current, namely 1 to 2.5 microamperes, dictated by the current mirror (T2 cannot give more than Iref/2). The node N2 can then rise only to a voltage level that will be lower than that of the node N1. The differential amplifier switches over to the other direction.

Figure 5A:
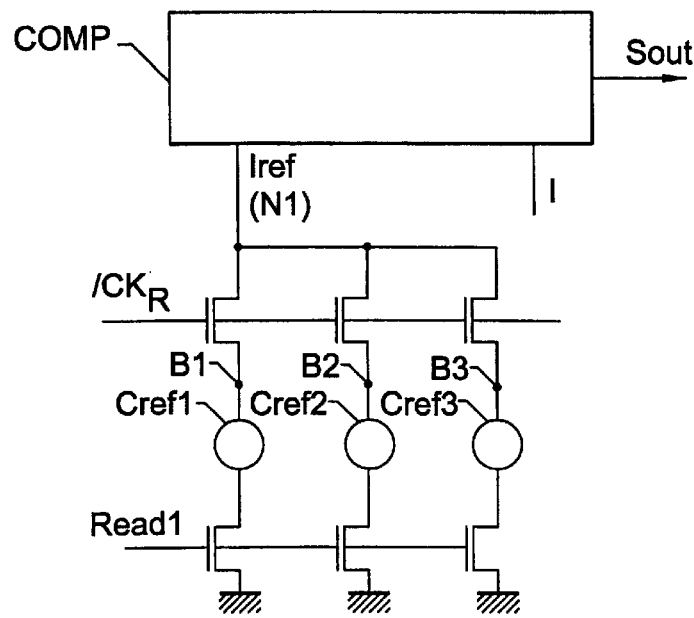
FIGS. 5a and 5b show an alternative embodiment of the invention where there are several parallel reference cells.

Instead of a single reference cell, it is advantageously planned to have several reference cells parallel-connected (see FIG. 5a). This makes it possible to mask a defect in the programming of a reference cell and therefore improve the reliability of the circuit. The current mirror will then be adjusted accordingly.

Figure 3:
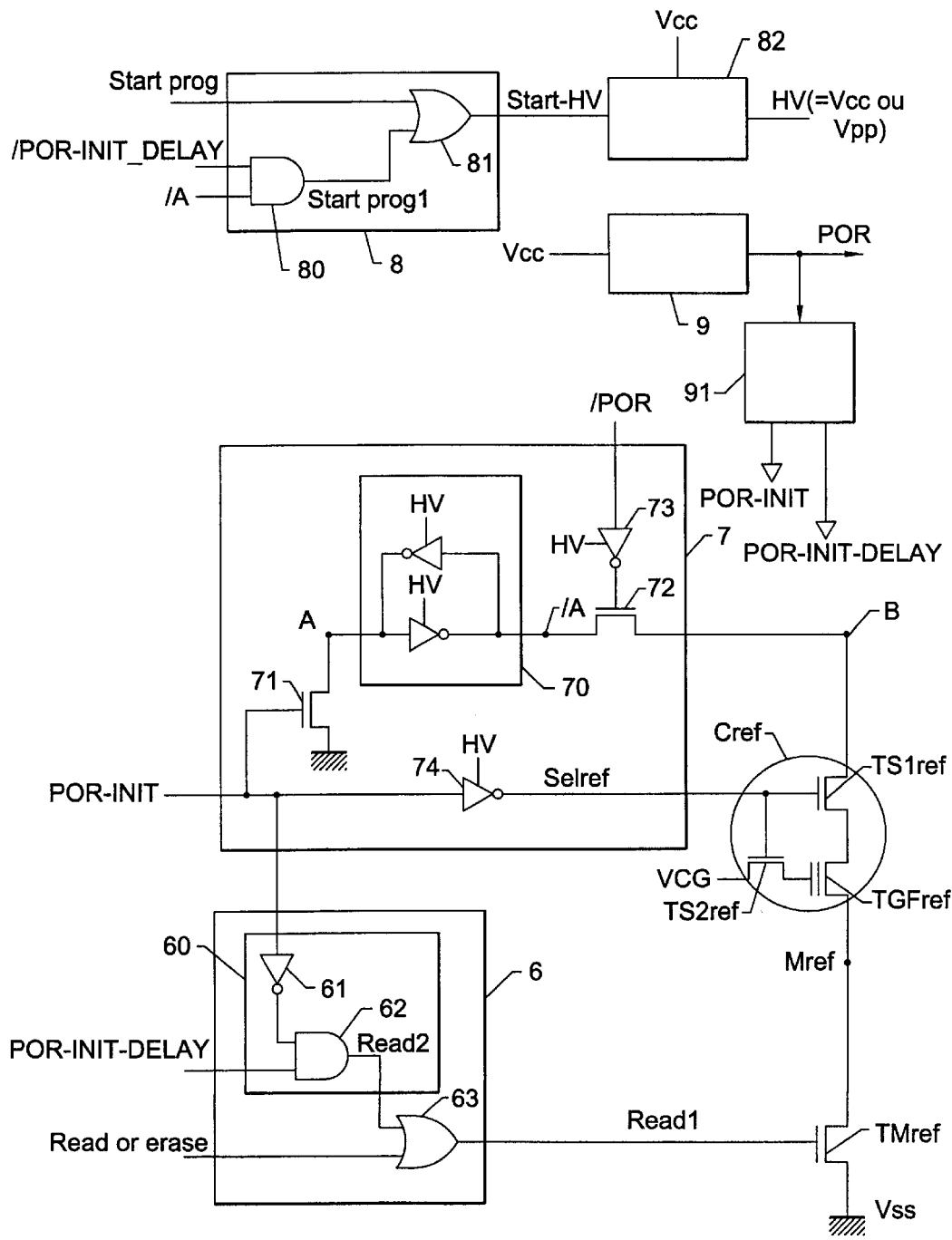
FIG. 3 shows a device for the control and programming of a reference cell according to the invention.
Figure 4:
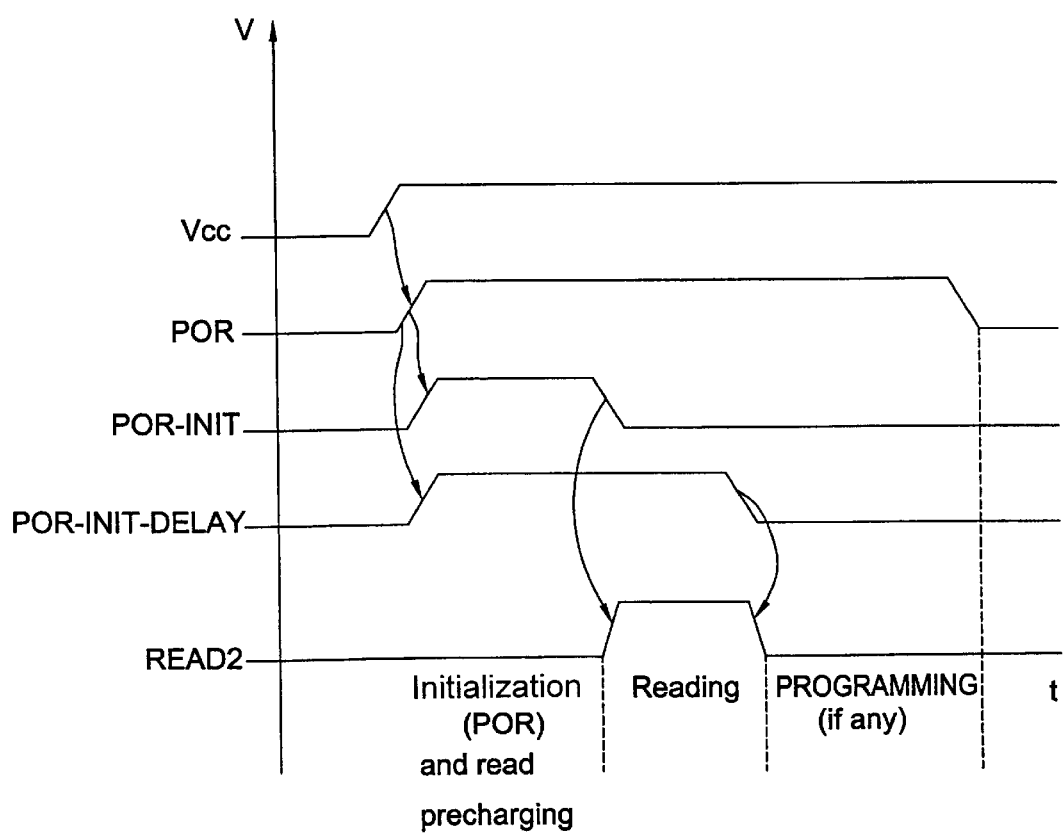
FIG. 4 is a graph showing the different sequencing signals of a control and programming device such as the one shown in FIG. 3.

FIG. 3 shows a drawing of a circuit for the control and programming of the reference cell or cells. Indeed, when they come off the production line, the memory cells are blank. It is therefore necessary to plan for the programming of the reference cell so that it possible to then read the memory cell. According to the invention, it is planned to control the state of the reference cell and then, if necessary, to program it during the power-on reset phase of the integrated circuit. It is known that this power-on reset phase is activated by the detection of the powering on of the integrated circuit. As shown in FIG. 4, when the level of the supply voltage reaches a certain threshold, indicating that the integrated circuit has been powered on, a particular circuit activates a power-on reset signal POR. While this signal POR is active, namely for a period of some milliseconds, the integrated circuit is reset, i.e. its registers, the state of the inputs/outputs of the different internal circuits, etc are reset. Throughout the duration of this power-on reset operation, the integrated circuit is inaccessible externally.

In the invention, it is chosen to carry out the reading and programming, if any, of the reference cells during this power-on reset phase. To this end, two additional signals, POR-INIT and POR-INIT-DELAY, generated from the signal POR, are used to carry out the reading. This is carried out at the end of a certain period of time after the start of the power-on reset operation. Then, if necessary, any programming operation before the end of the power-on reset phase is carried out.

The descent of the first signal POR-INIT activates the read operation. The descent of the second signal POR-INIT-DELAY activates the programming operation. The programming comes to an end with the descent of the power-on reset command signal POR. The signals POR-INIT and POR-INIT-DELAY are obtained from the signal POR, for example by monostable circuits activated by the rise of the signal POR.

The control signal must also enable application in operational mode, namely after the initializing phase, of the read bias voltages. FIG. 3 therefore shows an exemplary embodiment of a circuit for the control and programming of the reference cell according to the invention, using the signals POR-INIT and POR-INIT-DELAY described here above.

This control circuit has three circuits. These include a first circuit 6 to command the ground connection of the ground node Mref of the reference cell in order to perform the control read operation. There is a second circuit 7 to apply a read bias voltage to the gates of the selection transistors Ts1ref and Ts2ref of the reference cell and then apply a programming voltage if the reading shows that the cell is not programmed. Finally, there is a third circuit 8 to activate the generation of the high programming voltage Vpp and, as the case may be, enable the programming of the reference cell.

These circuits are driven by the signals described here above, POR, POR-INIT and POR-DELAY (or their reverse signals). The signal POR is delivered by a circuit 9 for the detection of the powering on of the supply voltage. A circuit 91 comprising, for example monostable circuits, makes it possible to provide the signals POR-INIT and POR-INIT-DELAY from the signal POR: indeed, they are pulses of calibrated duration whose emission at output of the circuit 5 is activated by the leading edge of the signal POR.

The circuit 6 comprises logic gates to command the switching over of the ground to the ground node Mref. For each reference cell Cref, the switching over is provided by an associated switching transistor TMref driven at its gate by the signal Read1. The signal Read1 is normally activated by a read command /RE for reading the cells of the memory.

In the invention, it can also be activated during the power-on reset phase to enable the control reading of the reference cell. To this end, the circuit 6 comprises a first logic circuit 60 comprising an inverter 61 and an AND gate 62. The inverter 61 receives the signal POR-INIT at input. The output of the inverter 61 is applied to an input of the AND gate 62 which receives the signal POR-INIT-DELAY at the other input. The AND gate 62 delivers, at output, a command signal for the control reading of the reference cell Read2. The signal Read2 obtained is shown in FIG. 4. It is activated by the descent to zero of the signal POR-INIT and deactivated with the descent to zero of the signal POR-INIT-DELAY. The circuit 6 furthermore comprises an OR logic gate 63 to activate the switching command Read1 either for a control read operation (Read2) or for a reading of the cells of the memory (Read).

Thus, the control read command signal Read2, a memory read command signal Read derived from the memory read command signal /RE, and a memory erasure command signal Erase derived from the write command signal /WE, are applied to the OR logic gate 63. This gate 63 delivers, at output, the switchover command signal Read1 applied to the ground switching transistor TMref associated with the reference cell.

The circuit 7 enables the control read operation during the power-on reset phase, and as the case may be, the activation of the programming of the reference cell. In operational mode, after the power-on reset phase, it enables the application to the reference cell of the read bias voltages. The circuit 7 is connected firstly to the voltage node B for the connection of the reference cell to the reference bit line B1ref (between the first switching transistor TCref and the reference cell). This circuit controls the command signal Selref applied to the gate of the reference cell selection transistors.

The control and programming method according to the invention is as follows. During the power-on reset phase, the voltage node B is insulated from the current comparison circuit (the circuit is not active and nor is the switching transistor TCref). The circuit 7 can therefore precharge the voltage node B to Vcc. If the reference cell is programmed, it is on and draws the voltage node B to the ground. The potential at the voltage node B shifts. If the reference cell is not programmed, it is not conductive and the potential at the voltage node B does not change(it remains at Vcc). A determination of whether or not the voltage node potential changes is used in the invention to activate or not activate the programming of the reference cell.

The circuit 7, in the example, comprises a latch 70 (two looped inverters). A terminal A of the latch is connected to the drain of an N type MOS transistor 71. This transistor 71 has its source connected to the ground Vss. It is driven at its gate by the signal POR-INIT. The complementary terminal /A of the latch 70 is connected to the voltage node B by an N type MOS transistor 72. The gate of the transistor 72 is driven by the output of an inverter 73 which, at input, receives the reverse /POR of a poweron reset command signal POR.

The circuit 7 furthermore comprises an inverter 74 which receives the signal POR-INIT at input and delivers, at output, the signal Selref applied to the gates of the selection transistors of the reference cell. The gate of the floating-gate transistor TGFref of the reference cell is biased by the voltage Vcg. This reference voltage is the same in read mode as in programming mode, namely it is equal to zero volts. The reference cell has not been erased.

The circuit 8 enables the activation of the high voltage generator not only following the reception of a programming command /WE but also for the reference cell control phase. If the control read operation shows that the reference cell is not programmed, the high voltage generator is activated so that the programming of this cell can be done.

In the example shown in FIG. 3, the circuit 8 has a first AND logic gate 80 receiving, as inputs, the reverse of the signal POR-INIT-DELAY and the output /A of the latch 70 of the circuit 7. At output, it delivers a reference cell programming command signal referenced Startprog1. This signal and the memory cells programming signal Startprog activated by the reception of a programming command for the memory /WE are applied as inputs of an OR logic gate 81 which delivers, at output, the signal Start-HV for activating the programming high voltage generator 82. Typically, this signal Start-HV, when it is active, validates the clock signal of the generator and the output HV of the high voltage generator rises to Vpp. When it is not activated, the clock signal is not transmitted and the output HV of the high voltage generator remains at Vcc.

During the power-on reset phase, the working of the reference cell read and programming control circuit that has just been described is as follows. The first phase is a phase for the precharging of the latch at the high level of the signal POR-INIT. The transistor 71 forces the node A to zero volts. Since the signal POR is at the high level, the transistor 72 is on and the voltage node B is precharged at Vcc.

The second phase is the control read phase. It is activated by the drop of the signal POR-INIT, the signal POR-INIT-DELAY being for its part still in the high state. In this case, the signal Read2 is activated (at 1). This commands the ground connection of the ground node Mref of the reference cell.

Since the signal POR-INIT-DELAY is still at 1, the signal Startprog1 is not active. The output HV of the high voltage generator is therefore at Vcc. With the signal POR-INIT having dropped to zero, we therefore have Selref at Vcc. Furthermore, since the gate bias voltage VCG of the reference cell is at zero volts and so is the ground node Mref, if the reference cell is programmed, it comes on and draws the voltage node B to zero. If the reference cell is not programmed, it is not on and the voltage node B remains at Vcc. If the reference cell is programmed, the node /A will switch over to zero and (A to Vcc) before the end of the control read phase marked by the descent of the signal POR-INIT-DELAY. If on the contrary, the reference cell is not programmed, the node /A remains unchanged at Vcc throughout the duration of the control reading operation.

The descent of the signal POR-INIT-DELAY marks the end of the reading operation and the beginning of the programming phase. If the node /A is still at Vcc, the signal Startprog1 then goes to the active state, the signal Start-HV goes to the high state. The leading edge of this signal activates the high voltage generator 32. The output HV of the generator then goes from Vcc to the high programming voltage Vpp. The inverter 74 switches this level VPP to the signal Selref applied to the gates of the selection transistors of the reference cell. The latch 70 and the transistor 72 switch the level Vpp to the voltage node B. Since the gate of the floating-gate transistor and the ground node are always at zero volts, the reference cell is in a programming state.

The programming comes to an end before the descent of the power-on reset command signal POR. The descent of the signal POR indeed turns the transistor 72 off. This has the effect of insulating the voltage node B from the circuit 7. The high-voltage generator is then automatically stopped by an internal computer. With the signal POR-INIT remaining at zero, the signal Selref then follows the level of the output HV of the high voltage generator 82: Vcc or Vpp if the generator is reactivated by the new leading edge on the signal Start-HV.

The reference cell read and programming circuit according to the invention is highly advantageous, for it operates during the power-on reset of the integrated circuit, activated by the signal POR, whereas the circuit cannot be used from the outside. There is therefore no loss in the access time of the cell. Furthermore, there is a systematic control of the reference cell whenever the integrated circuit is powered on. Thus, if the reference cell is no longer programmed because it has lost charges, the control circuit detects it and reprograms the cell. The read device according to the invention is therefore highly reliable.

Very little additional circuitry is needed to implement the method according to the invention, which uses the power-on resetting phase to carry out the control of the reference cell. Furthermore, few elements are required to withstand the high voltage Vpc: only the latch 70, the inverters 73 and 74 and transistors 71 and 72 have to switch over from the high voltage to program the reference cell. The control circuit according to the invention therefore takes up minimal space.

The invention can be applied to any integrated circuit comprising an EEPROM type memory. It is not limited to the architecture described. In particular, it can be applied to any EEPROM memory cell comprising at least one selection transistor.

Figure 5B:
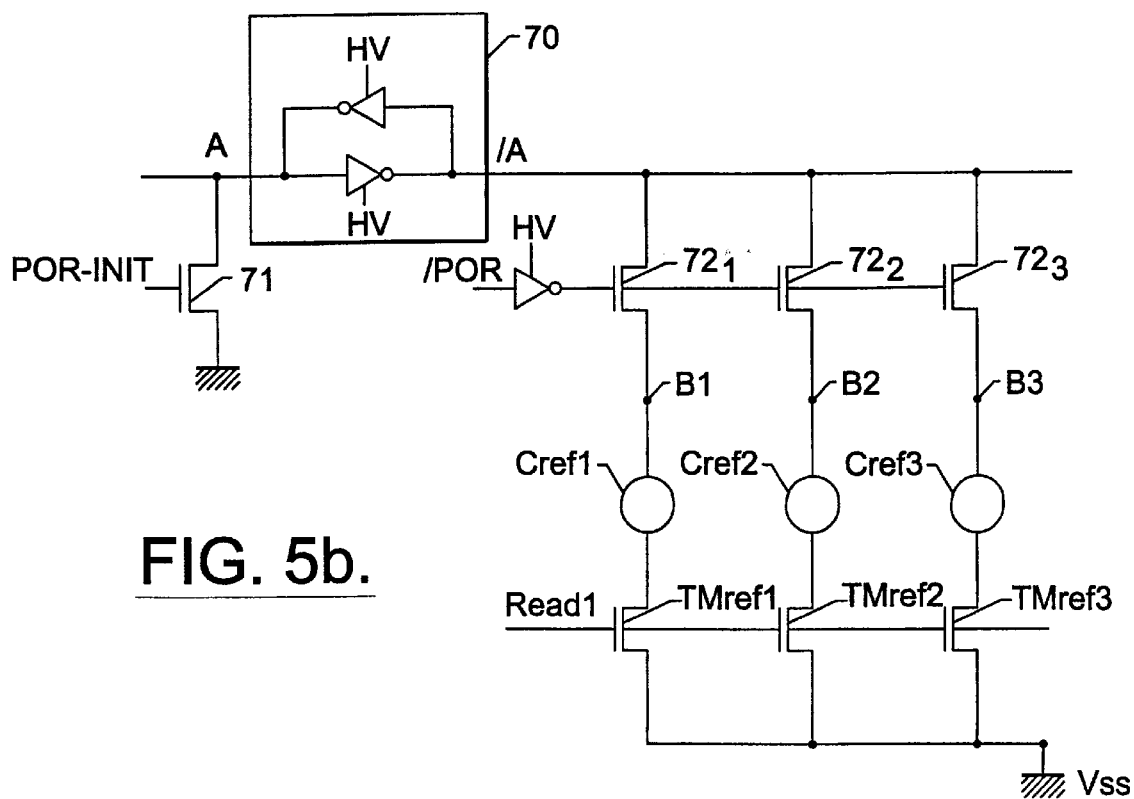

The invention can also be applied to EEPROM architectures comprising several reference cells. As shown in FIG. 5a, it is possible to have several parallel-connected reference cells. This improves the reliability of the device (in particular, there are fewer pieces discarded when they come off the production line). According to the invention, it is then planned to control all these cells at the same time. This may be done for example by the same control circuit. FIG. 5b thus shows three reference cells Cref1, Cref2 and Cref3 with the associated ground switching transistors TMref1, TMref2, TMref3.

It has been seen that the parallel connection of reference cells enables the read device to work accurately even if one or more reference cells are defective (not programmed or deprogrammed). If there are n reference cells connected in parallel, the device will work accurately so long as there are no more than p defective cells, 1<P<n. In this case, according to the invention, what has to be done is to detect the fact that more than p cells are defective. The circuit 70 is therefore sized so that the node /A does not shift (remains at VCC), only from p+1 defective cells, to activate the programming of the reference cells. In the example of three reference cells, the circuit 70 will be sized for example to switch over from two defective cells.

For the practical embodiment of the control circuit, it is necessary to provide for one transistor 72 per reference cell. FIG. 5b thus shows the transistors $72_1$, $72_2$ then $72_3$ respectively connected to the nodes B1, B2, B3 of the reference cells Cref1, Cref2, Cref3.

In one variant, it is possible to provide for one control circuit per reference cell, possibly associated with a combinational circuit to permit the programming of the defective cells only if there are more of them than p. This makes it possible not to program the cells that are not defective. The choice of either embodiment depends on the circumstances and on the space available in the integrated circuit. In any case, if there are n reference cells (with n greater than or equal to 1), these n cells are controlled in read mode and if more than p cells are defective (with p ranging from 1 to n), at least the reference cells found to be defective are reprogrammed.

That which is claimed is:

1. A device for reading a cell of a non-volatile memory, the device comprising:
    at least one reference cell in a programmed state; and
    a current comparison circuit for comparing a current flowing in the at least one reference cell with a current flowing in a cell selected for reading.

2. A device according to claim 1, wherein the non-volatile memory comprises an EEPROM and each cell of the EEPROM comprises a floating-gate transistor and at least one selection transistor.

3. A device according to claim 2, wherein a gate voltage applied to the floating-gate transistor of the at least one reference cell and to the floating-gate transistor of the cell selected for reading is 0 volts.

4. A device according to claim 1, further comprising:
    a control circuit for control and programming of the at least one reference cell;
    a power-on detection circuit for detecting the power-on of the non-volatile memory; and
    an activation circuit, controlled by the power-on detection circuit, for activating the control circuit during a power-on reset phase.

5. A device according to claim 1, wherein the at least one reference cell comprises a voltage node, a ground node, and a floating gate transistor having a gate, and wherein the control circuit comprises a precharging circuit for precharging the voltage node of the at least one reference cell at a supply voltage and for applying a read bias voltage to the gate of the floating-gate transistor of the at least one reference cell.

6. A device according to claim 5, further comprising a programming circuit which receives an activation signal from the voltage node of the at least one reference cell, and wherein the programming circuit comprises a high voltage generation activator which activates the generation of a high voltage to be applied to the at least one reference cell by the precharging circuit.

7. A device according to claim 1, further comprising a reference bit circuit cooperating with the at least one reference cell, and wherein the current comparison circuit comprises:
    a reference circuit for current supply and biasing of the reference bit circuit, the reference circuit including a current generator and a current-voltage converter connected in series between a supply voltage and an output node; and
    a second circuit for current supply and biasing of the cell selected for reading, the second circuit including a current generator and a current-voltage converter connected in series between a supply voltage and an output node.

8. A device according to claim 7, wherein each of the reference circuit and the second circuit include an activation transistor connected between a respective supply voltage and current generator.

9. A device according to claim 8, wherein the current generator of the reference circuit comprises a first PMOS transistor having a gate connected to a drain, and a source connected to the supply voltage through a respective activation transistor; and wherein the current generator of the second circuit comprises a second PMOS transistor having a source connected to the supply voltage through a respective activation transistor, and having a gate connected to the gate of the first PMOS transistor to form a current mirror.

10. A device according to claim 9, wherein the current-voltage converter of the reference circuit comprises a first NMOS transistor connected between the drain of the first PMOS transistor and the output node of the reference circuit, and a first inverter connected between the source of the first NMOS transistor and the gate of the first NMOS transistor; and wherein the current-voltage converter of the second circuit comprises a second NMOS transistor connected between the drain of the second PMOS transistor and the output node of the second circuit, and a second inverter connected between the source of the second NMOS transistor and the gate of the second NMOS transistor.

11. A device according to claim 10, wherein the current comparison circuit further comprises an amplifier having an input connected to the output node of the reference circuit, and an input connected to the output node of the second circuit.

12. A device for reading a cell of an EEPROM comprising a floating-gate transistor, the device comprising:
    at least one reference cell in a programmed state;
    a current comparison circuit for comparing a current flowing in the at least one reference cell with a current flowing in a cell selected for reading;
    a control circuit for controlling and programming the at least one reference cell;
    a power-on detection circuit for detecting the power-on of the EEPROM; and
    an activation circuit, controlled by the power-on detection circuit, for activating the control circuit during a power-on reset phase.

13. A device according to claim 12, wherein a gate voltage applied to the floating-gate transistor of the at least one reference cell and to the floating-gate transistor of the cell selected for reading is 0 volts.

14. A device according to claim 12, wherein the at least one reference cell comprises a voltage node and a ground node, and wherein the control circuit comprises a precharging circuit for precharging the voltage node of the at least one reference cell at a supply voltage and for applying a read bias voltage to the gate of the floating-gate transistor of the at least one reference cell.

15. A device according to claim 14, further comprising a programming circuit which receives an activation signal from the voltage node of the at least one reference cell, and wherein the programming circuit comprises a high voltage generation activator which activates the generation of a high voltage to be applied to the at least one reference cell by the precharging circuit.

16. A device according to claim 12, further comprising a reference bit circuit cooperating with the at least one reference cell, wherein the current comparison circuit comprises:
   a reference circuit for current supply and biasing of the reference bit circuit, the reference circuit including a current generator and a current-voltage converter connected in series between a supply voltage and an output node; and
   a second circuit for current supply and biasing of the cell selected for reading, the second circuit including a current generator and a current-voltage converter connected in series between a supply voltage and an output node.

17. A device according to claim 16, wherein each of the reference circuit and the second circuit include an activation transistor connected between a respective supply voltage and current generator.

18. A device according to claim 17, wherein the current generator of the reference circuit comprises a first PMOS transistor having a gate connected to a drain, and a source connected to the supply voltage through a respective activation transistor; and wherein the current generator of the second circuit comprises a second PMOS transistor having a source connected to the supply voltage through a respective activation transistor, and having a gate connected to the gate of the first PMOS transistor to form a current mirror.

19. A device according to claim 18, wherein the current-voltage converter of the reference circuit comprises a first NMOS transistor connected between the drain of the first PMOS transistor and the output node of the reference circuit, and a first inverter connected between the source of the first NMOS transistor and the gate of the first NMOS transistor; and wherein the current-voltage converter of the second circuit comprises a second NMOS transistor connected between the drain of the second PMOS transistor and the output node of the second circuit, and a second inverter connected between the source of the second NMOS transistor and the gate of the second NMOS transistor.

20. A device according to claim 19, wherein the current comparison circuit further comprises an amplifier having an input connected to the output node of the reference circuit, and an input connected to the output node of the second circuit.

21. An integrated circuit comprising:
   an array of memory cells organized in a matrix comprising word lines and bit lines, each memory cell comprising a floating gate transistor; and
   a read device comprising
      at least one reference cell in a programmed state, and
      a current comparison circuit for comparing a current flowing in the at least one reference cell with a current flowing in a cell selected for reading.

22. An integrated circuit according to claim 21, wherein a gate voltage applied to the floating-gate transistor of the at least one reference cell and to the floating-gate transistor of the cell selected for reading is 0 volts.

23. An integrated circuit according to claim 21, wherein the read device further comprises:
   a control circuit for control and programming of the at least one reference cell;
   a power-on detection circuit for detecting the power-on of the integrated circuit; and
   an activation circuit, controlled by the power-on detection circuit, for activating the control circuit during a power-on reset phase.

24. An integrated circuit according to claim 23, wherein the at least one reference cell comprises a voltage node and a ground node, and wherein the control circuit comprises a precharging circuit for precharging the voltage node of the at least one reference cell at a supply voltage, and for applying a read bias voltage to the gate of the floating-gate transistor of the at least one reference cell.

25. An integrated circuit according to claim 24, wherein the read device further comprises a programming circuit which receives an activation signal from the voltage node of the at least one reference cell, and wherein the programming circuit comprises a high voltage generation activator which activates the generation of a high voltage to be applied to the at least one reference cell by the precharging circuit.

26. An integrated circuit according to claim 21, wherein the read device further comprises a reference bit circuit cooperating with the at least one reference cell, and a second bit circuit cooperating with the cell selected for reading, wherein the current comparison circuit comprises:
   a reference circuit for current supply and biasing of the reference bit circuit, the reference circuit including a current generator and a current-voltage converter connected in series between a supply voltage and an output node; and
   a second circuit for current supply and biasing of the second bit circuit, the second circuit including a current generator and a current-voltage converter connected in series between a supply voltage and an output node.

27. An integrated circuit according to claim 26, wherein each of the reference circuit and the second circuit include an activation transistor connected between a respective supply voltage and current generator.

28. An integrated circuit according to claim 27, wherein the current generator of the reference circuit comprises a first PMOS transistor having a gate connected to a drain, and a source connected to the supply voltage through a respective activation transistor; and wherein the current generator of the second circuit comprises a second PMOS transistor having a source connected to the supply voltage through a respective activation transistor, and having a gate connected to the gate of the first PMOS transistor to form a current mirror.

29. An integrated circuit according to claim 28, wherein the current-voltage converter of the reference circuit comprises a first NMOS transistor connected between the drain of the first PMOS transistor and the output node of the reference circuit, and a first inverter connected between the source of the first NMOS transistor and the gate of the first NMOS transistor; and wherein the current-voltage converter of the second circuit comprises a second NMOS transistor connected between the drain of the second PMOS transistor and the output node of the second circuit, and a second inverter connected between the source of the second NMOS transistor and the gate of the second NMOS transistor.

30. An integrated circuit according to claim 29, wherein the current comparison circuit further comprises an amplifier having an input connected to the output node of the reference circuit, and an input connected to the output node of the second circuit.

31. A method for the reading of cells of a non-volatile memory, the method comprising:
   detecting a current in a programmed reference cell;
   detecting a current in a memory cell selected for reading; and
   comparing the current in the programmed reference cell with the current in the selected memory cell.

32. A method according to claim 31, wherein the non-volatile memory comprises an EEPROM and each cell of the EEPROM includes a floating-gate transistor, and further comprising the step of applying a zero voltage as a gate voltage to respective floating-gate transistors of the programmed reference cell and the memory cell selected for reading.

33. A method according to claim 31, further comprising the steps of:

detecting a powering-on operation of the non-volatile memory; and programming the reference cell during a power-on reset phase of the non-volatile memory in response to the detecting step.

34. A method according to claim 31, wherein the non-volatile memory includes a read circuit comprising n parallel-connected reference cells, and further comprising the steps of:

determining whether each of the n parallel-connected reference cells is a defective reference cell; and programming at least the defective reference cells if more than p reference cells are found to be defective, where 1<p<n.

35. A method for the reading of cells of an EEPROM, the method comprising:

detecting a powering-on operation of the EEPROM;

programming a reference cell during a power-on reset phase of the EEPROM in response to the detecting step; and comparing a current in the programmed reference cell with a current in a memory cell selected for reading.

36. A method according to claim 35, wherein each cell of the EEPROM includes a floating-gate transistor, and further comprising the step of applying a zero voltage as a gate voltage to respective floating-gate transistors of the programmed reference cell and the memory cell selected for reading.

37. A method according to claim 35, wherein the EEPROM includes a read circuit comprising n parallel-connected reference cells, and further comprising the steps of:

determining whether each of the n parallel-connected reference cells is a defective reference cell; and programming at least the defective reference cells if more than p reference cells are found to be defective, where 1<p<n.

38. A device for reading cells of an EEPROM, the device comprising:

at least one reference cell in a programmed state;

a current comparison circuit for comparing a current flowing in the at least one reference cell with a current flowing in a cell selected for reading;

a control circuit for control and programming of the at least one reference cell;

a power-on detection circuit for detecting the power-on of the EEPROM; and an activation circuit, controlled by the power-on detection circuit, for activating the control circuit during a power-on reset phase.

39. A device according to claim 38, wherein each cell of the EEPROM comprises a floating-gate transistor and at least one selection transistor and wherein a gate voltage applied to the floating-gate transistor of the at least one reference cell and to the floating-gate transistor of the cell selected for reading is 0 volts.

40. A device according to claim 38, wherein the at least one reference cell comprises a voltage node, a ground node, and a floating gate transistor having a gate, and wherein the control circuit comprises a precharging circuit for precharging the voltage node of the at least one reference cell at a supply voltage and for applying a read bias voltage to the gate of the floating-gate transistor of the at least one reference cell.

41. A device according to claim 40, further comprising a programming circuit which receives an activation signal from the voltage node of the at least one reference cell, and wherein the programming circuit comprises a high voltage generation activator which activates the generation of a high voltage to be applied to the at least one reference cell by the precharging circuit.

42. An integrated circuit comprising:

an EEPROM including an array of memory cells, each memory cell comprising a floating gate transistor; and a read device comprising
at least one reference cell in a programmed state;
a current comparison circuit for comparing a current flowing in the at least one reference cell with a current flowing in a cell selected for reading;
a control circuit for control and programming of the at least one reference cell;
a power-on detection circuit for detecting the power-on of the EEPROM; and
an activation circuit, controlled by the power-on detection circuit, for activating the control circuit during a power-on reset phase.

43. An integrated circuit according to claim 42, wherein a gate voltage applied to the floating-gate transistor of the at least one reference cell and to the floating-gate transistor of the cell selected for reading is 0 volts.

44. An integrated circuit according to claim 42, wherein the at least one reference cell comprises a voltage node and a ground node, and wherein the control circuit comprises a precharging circuit for precharging the voltage node of the at least one reference cell at a supply voltage and for applying a read bias voltage to a gate of the floating-gate transistor of the at least one reference cell.

45. An integrated circuit according to claim 44, further comprising a programming circuit which receives an activation signal from the voltage node of the at least one reference cell, and wherein the programming circuit comprises a high voltage generation activator which activates the generation of a high voltage to be applied to the at least one reference cell by the precharging circuit.

* * * * *